United States Patent [19]
Matsuoka

[11] Patent Number: 5,536,969
[45] Date of Patent: Jul. 16, 1996

[54] IC CARRIER

[75] Inventor: Noriyuki Matsuoka, Yokohama, Japan

[73] Assignee: Yamaichi Electronics Co., Ltd., Tokyo, Japan

[21] Appl. No.: 495,299

[22] Filed: Jun. 28, 1995

Related U.S. Application Data

[63] Continuation of Ser. No. 169,647, Dec. 20, 1993, abandoned.

[30] Foreign Application Priority Data

Dec. 18, 1992 [JP] Japan ..................... 4-355595

[51] Int. Cl.[6] ..................... H01L 23/495; H01L 23/48
[52] U.S. Cl. ..................... 257/666; 257/668; 257/676; 257/693
[58] Field of Search ..................... 257/666, 668, 257/676, 690, 692, 693, 698, 782, 784, 786, 718

[56] References Cited

U.S. PATENT DOCUMENTS

| | | | |
|---|---|---|---|
| 3,409,861 | 11/1968 | Barnes et al. | |
| 3,892,312 | 7/1975 | Tems | 206/328 |
| 4,598,308 | 7/1986 | James et al. | |
| 4,692,790 | 9/1987 | Oyamada | |
| 4,718,548 | 1/1988 | Estrada et al. | 206/329 |
| 4,747,483 | 5/1988 | Grabbe | 206/329 |
| 4,881,639 | 11/1989 | Matsuoka et al. | 206/328 |
| 4,886,169 | 12/1989 | Ayers et al. | 206/591 |
| 4,918,513 | 4/1990 | Kurose et al. | 357/74 |
| 4,933,747 | 6/1990 | Schroeder | 257/727 |
| 5,066,245 | 11/1991 | Walker | 439/526 |
| 5,070,389 | 12/1991 | Noriyuki | |
| 5,076,794 | 12/1991 | Ganthier | |
| 5,133,256 | 7/1992 | Keaton | 101/481 |
| 5,139,437 | 8/1992 | Ikeya et al. | 439/266 |
| 5,168,993 | 12/1992 | Yen | 206/316 |
| 5,220,196 | 6/1993 | Michii et al. | 257/676 |
| 5,238,110 | 8/1993 | Ye | 206/329 |
| 5,289,032 | 2/1994 | Higgins, III et al. | 257/692 |
| 5,296,741 | 3/1994 | Kim | 257/723 |
| 5,309,326 | 5/1994 | Minozu | 361/748 |
| 5,389,820 | 2/1995 | Matsuoka | |

FOREIGN PATENT DOCUMENTS

| | | |
|---|---|---|
| 2036556 | 7/1988 | Japan |
| 1-272142 | 10/1989 | Japan |
| 3-29903 | 6/1991 | Japan |

*Primary Examiner*—Sara W. Crane
*Assistant Examiner*—Jhihan Clark
*Attorney, Agent, or Firm*—Wenderoth, Lind & Ponack

[57] ABSTRACT

An IC carrier comprises a carrier body having a wiring sheet with a pattern of leads on an upper surface thereof and an IC body on which the wiring sheet is superimposed. Each of the leads on the wiring sheet are provided with a first contact pad and a second contact pad. Each of contact pads is subjected to connection with a corresponding contact piece on the IC body, and each of the second contact pads is subjected to connection with a corresponding contact at an outer area of the superimposed portion. The second contact pads are arranged on an outer upper surface of the wiring sheet.

21 Claims, 15 Drawing Sheets

5,536,969

IC CARRIER

This application is a continuation of now abandoned application Ser. No. 08/169,647, filed on Dec. 20, 1993, now abandoned.

BACKGROUND OF THE INVENTION

1. Field of the Invention

This invention relates to an IC carrier on which an IC is removably carried so as to be subjected to delivery, storage, or connection with an IC socket.

2. Brief Description of the Prior Art

In the case where an IC has a plurality of IC contact elements arranged at very small pitches, it is difficult to connect contacts on a socket directly to those IC contact elements. The reason is that there is technical limitation in the miniaturization of the contacts and in reducing the pitches for implanting the contacts in the socket. Since the IC must be subjected to various kinds of aging tests, it is necessary to provide a means for enabling the IC contact elements to be connected with the socket as well as a testing device.

SUMMARY OF THE INVENTION

It is therefore an object of the present invention to provide an IC carrier, in which leads on an IC can be assuredly connected to contacts on a socket through a wiring sheet.

Another object of the present invention is to provide an IC carrier which is provided with a means for visually confirming a corresponding relation between leads on an IC and contacts on a socket.

To achieve the above objects, there is essentially provided an IC carrier comprising a carrier body having a wiring sheet with a pattern of leads on an upper surface thereof and an IC body on which the wiring sheet is superimposed. Each of the leads on the wiring sheet are provided with a first contact pad and a second contact pad, the first contact pad being subjected to connection with a corresponding contact piece on the IC body, the second contact pad being subjected to connection with a corresponding contact at an outer area of the superimposed portion. The second contact pads are arranged on an outer upper surface of the wiring sheet.

In another aspect of the invention, there is provided an IC carrier comprising a carrier body having a wiring sheet with a pattern of leads on an upper surface thereof and an IC body on which the wiring sheet is superimposed. Each of the leads on the wiring-sheet being provided with a first contact pad and a second contact pad, the first contact pad being subjected to connection with a corresponding contact piece on the IC body, the second contact pad being subjected to connection with a corresponding contact at an outer area of the superimposed portion. The second contact pads are arranged on an outer upper surface of the wiring sheet, and the wiring sheet is provided with an opening through which can be visually confirmed a corresponding relation between each of the contact elements on the IC body and each of the first contact pads on the wiring sheet.

DETAILED DESCRIPTION OF THE EMBODIMENTS

Figure 1A:
FIGS. 1a–1d are cross-sectional views of parts of an IC carrier according to a first embodiment of the present invention.
Figure 1B:
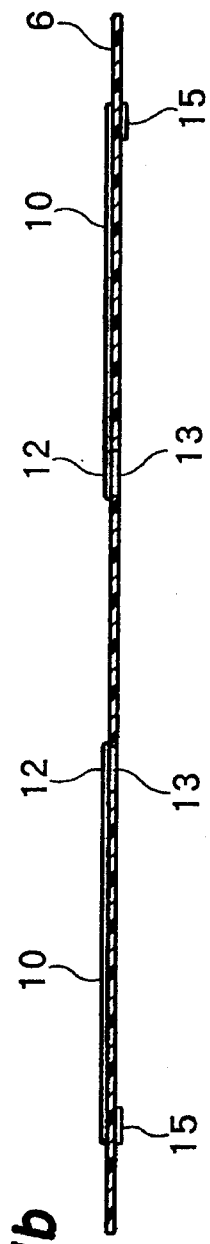
Figure 1C:
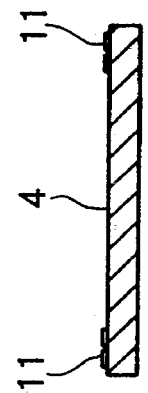
Figure 1D:
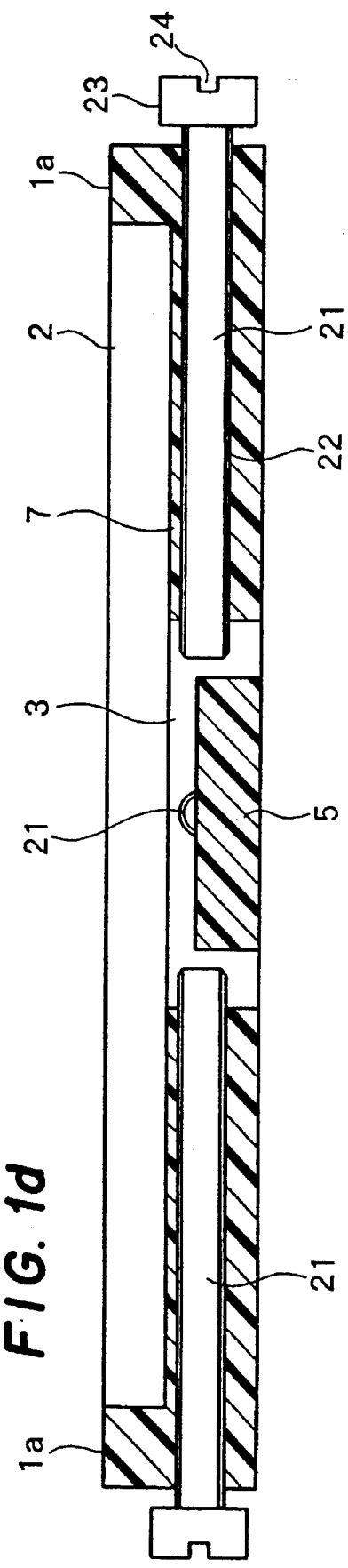
Figure 2:
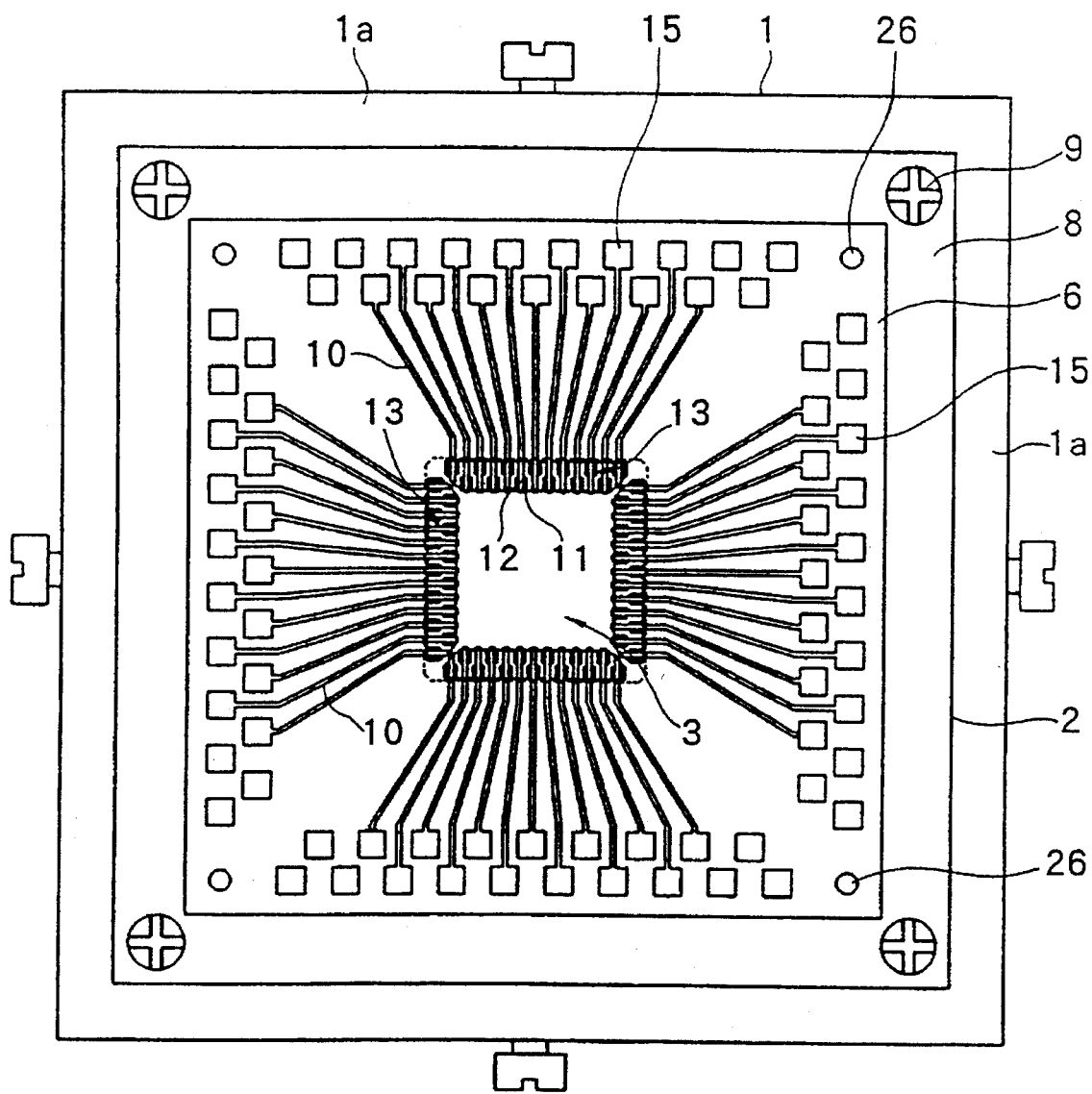
FIG. 2 is a plan view of the IC carrier of FIGS. 1a–1d, but already assembled.
Figure 3:
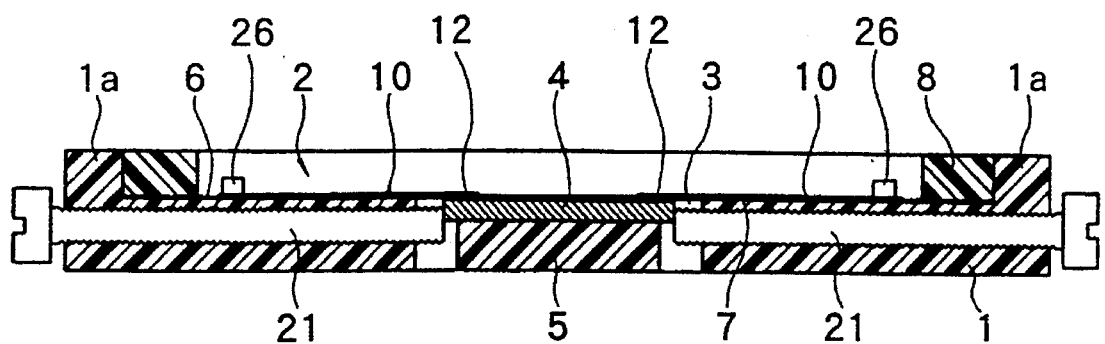
FIG. 3 is a cross-sectional view of FIG. 2.
Figure 4:
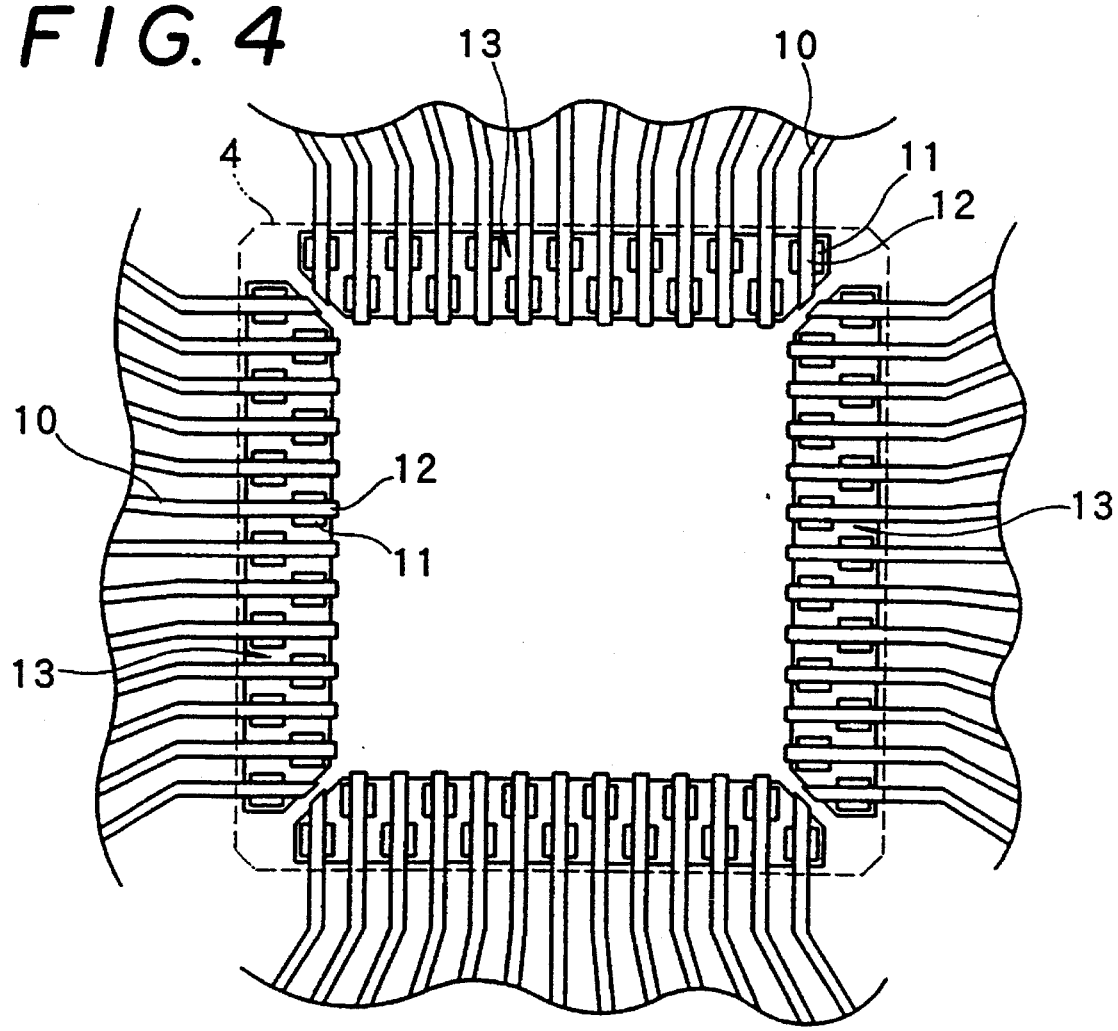
FIG. 4 is an enlarged plan view showing a contacting portion between a wiring sheet and an IC body in the above IC carrier.
Figure 5:
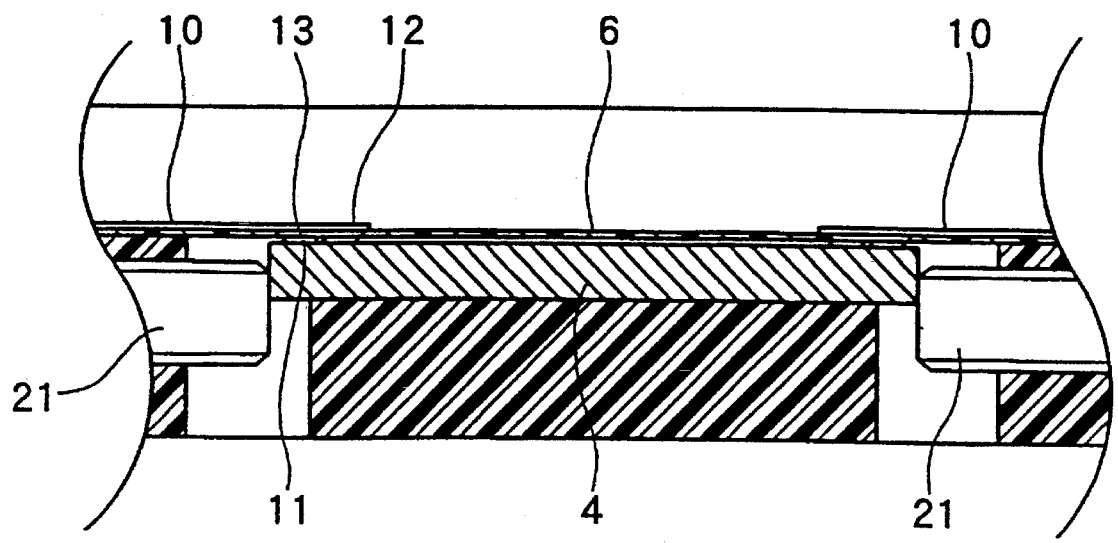
FIG. 5 is an enlarged cross-sectional view of FIG. 4.
Figure 6:
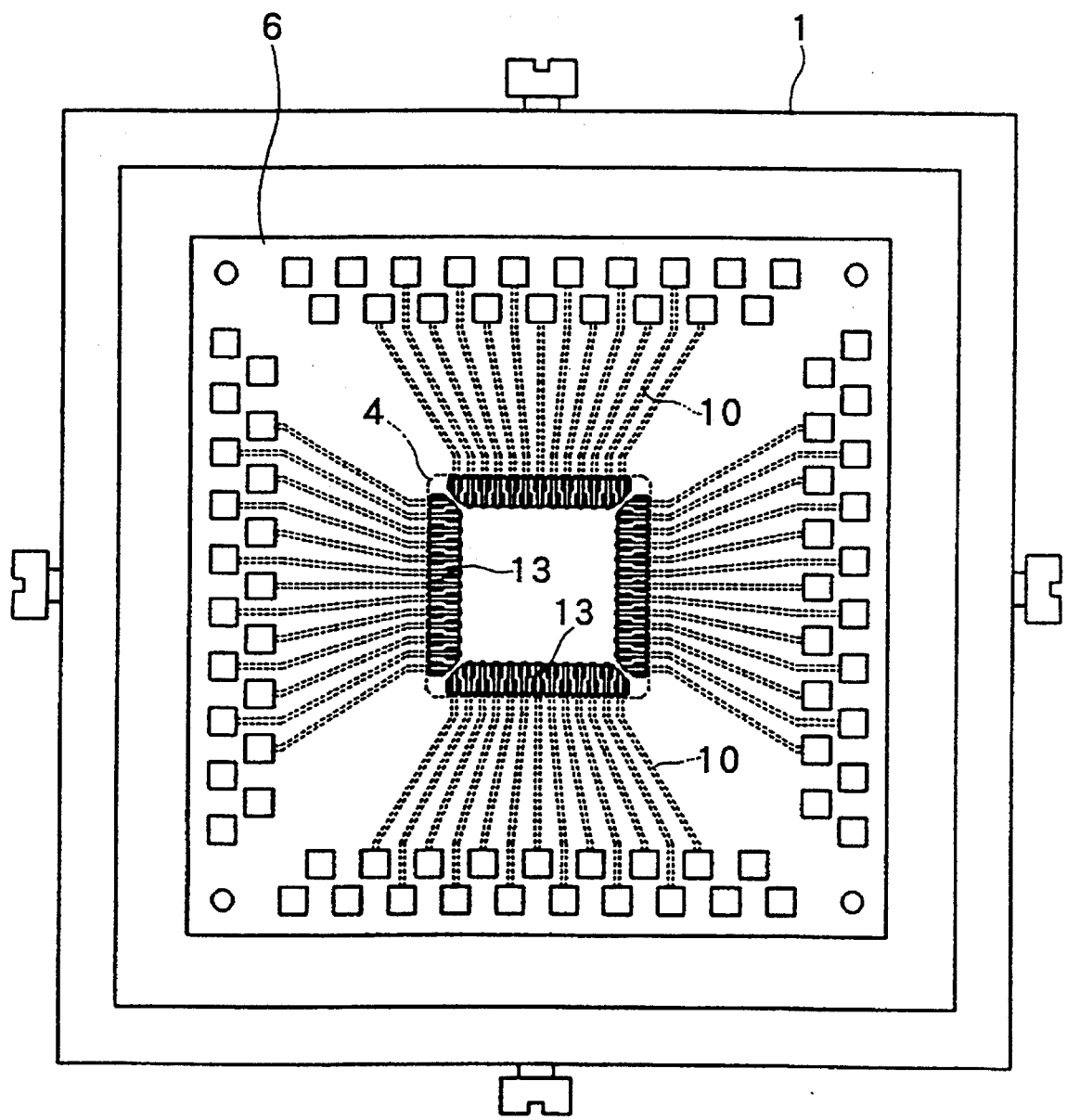
FIG. 6 is a plan view of an IC carrier according to a second embodiment of the present invention.
Figure 7:
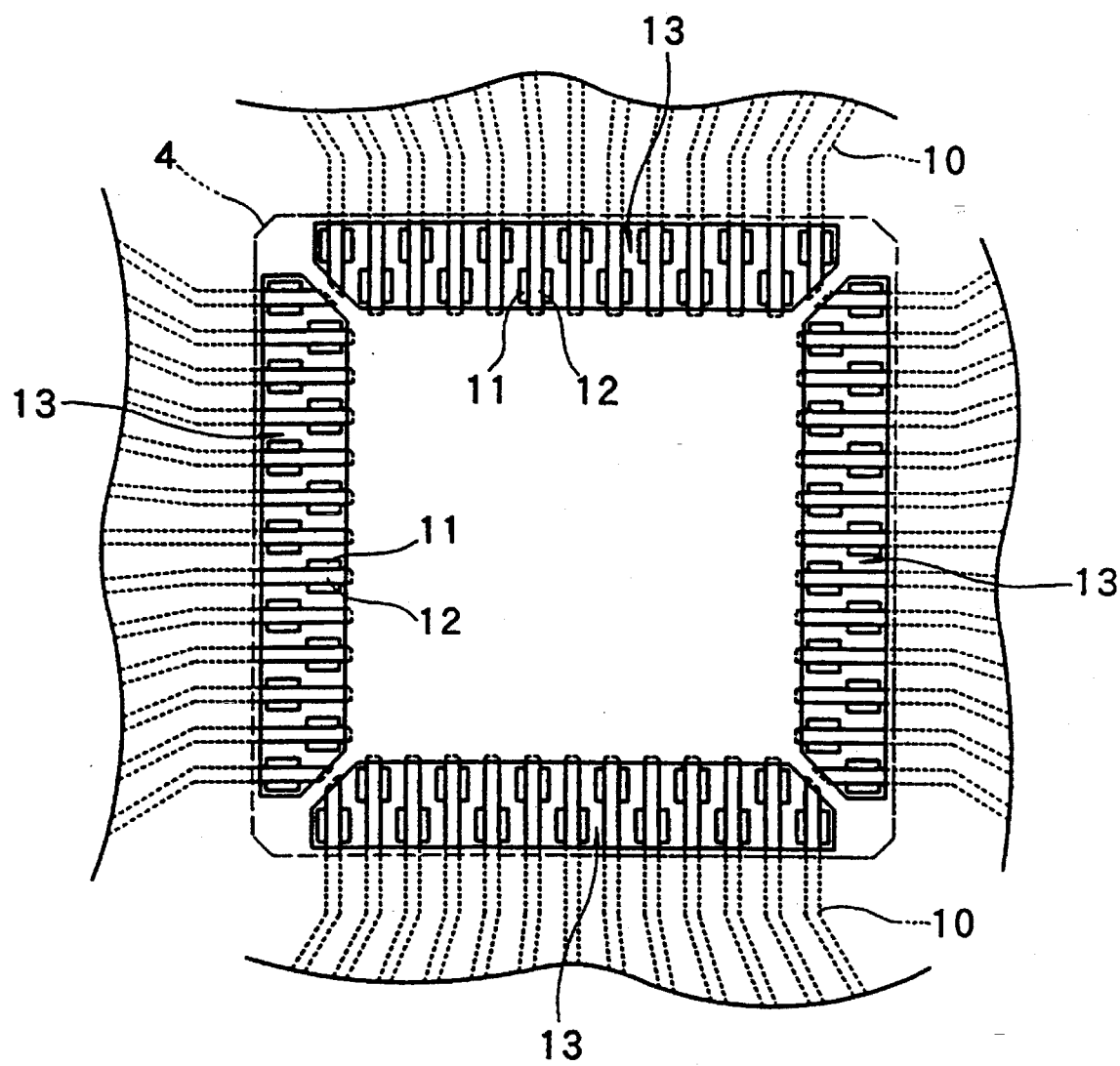
FIG. 7 is an enlarged plan view showing a contacting portion between a wiring sheet and an IC body in the above IC carrier.

Several embodiments of the present invention will be described in great detail with reference to FIGS. 1 through 22. As shown in FIGS. 1 through 3, as well as elsewhere, a carrier 1, which is made of an insulating material, is of a planar, generally square configuration. The carrier 1 includes a generally square sheet receiving portion 2 whose upper surface is open. An IC receiving portion 3 is formed in a central portion of the sheet receiving portion 2 and opens through an inner bottom surface of the sheet receiving portion 2. An IC body 4 is received in the IC receiving portion 3 and supported on a support seat 5 which is formed on an inner bottom surface of the IC receiving portion 3, while a wiring sheet 6 is received in the sheet receiving portion 2 and supported on a support seat 7 which is formed on a bottom surface of the sheet receiving portion 2.

The IC body 4, which is supported on the support seat 5, is in contact with or in opposite adjacent relation to a central portion of and covered with the wiring sheet 6 which is supported on the support seat 7. To satisfy the foregoing arrangement, an upper surface of the IC body 4, which is received in the IC receiving portion 3, is generally flush with the support seat 7.

Thus, the IC body 4 is in a superimposed relation to the wiring sheet 6 and assembled, as one piece, together with the carrier 1. FIGS. 1 and 2, for example, show one example of a means for assembling these component parts into one piece, in which a frame member 8 generally equal in its outer peripheral dimension to the sheet receiving portion 2 is formed, and this frame member 8 is fitted to an inner peripheral edge of the sheet receiving portion 2 with corner portions of the frame member 8 tightly secured to the carrier 1 by screws 9 or the like. As shown, for example, in FIGS. 1a, 2 and 3, the frame 8 has a central opening. By securing the wiring sheet 6 onto the support seat 7 of the carrier 1, the IC body 4 is held between the carrier 1 and the support seat 5.

Figure 17:
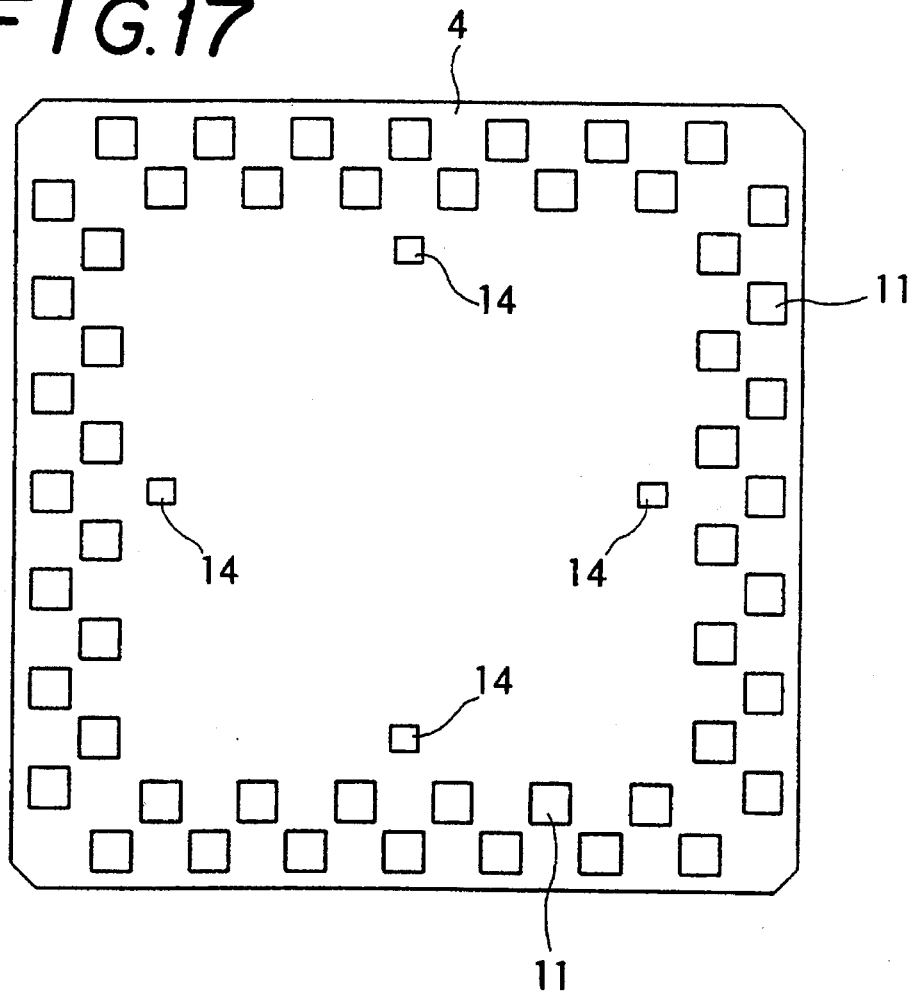
FIG. 17 is a plan view of an IC body.

As best shown in FIG. 17, the IC body 4 is of a Generally square outer configuration and has a number of contact elements 11 arranged in array on its upper surface. First contact pads 12, as will be described hereinafter, on the wiring sheet 6 are placed or superimposed on these contact elements 11, thereby creating an electrical connection between leads 10 and the contact elements 11.

The wiring sheet 6 is made of a flexible insulating material such as synthetic resin film, and has thereon a lead pattern corresponding to the contact elements 11 on the IC body 4. The wiring sheet 6 is made of a wiring substrate having a comparatively rigid property. The respective leads 10, which form the lead pattern, are intimately attached onto the wiring sheet 6 by, for example, printing, and radially extend from a central portion (superimposed portion relative to the IC body 4) of the wiring sheet 6 toward a peripheral portion thereof. Inner ends of the leads 10 extending to the superimposed portion are provided with the first contact pads 12 arranged at small pitches so as to be placed opposite to the contact elements 11 which are arranged likewise at small pitches on the upper surface of the IC body 4. Outer ends of the leads 10 extending to the peripheral portion of the wiring sheet 6 are provided with second contact pads 15 arranged at comparatively large pitches so as to be placed opposite to contacts which are arranged likewise at comparatively large pitches on a socket body. That is, in the lead pattern, the second contact pads 15 formed on the outer end of the lead pattern are widely spread toward the outer area of the IC body 4 so as to be subjected to connection with the contacts. For example, the second contact pads 15 are arranged side by side along an inner peripheral surface of the frame member 8 so that the second contact pads 15 are exposed for connection to contacts of an IC socket.

As shown in FIGS. 1 through 5, the lead pattern is formed on the upper surface side of the wiring sheet 6, and the first contact pads 12 are placed opposite to the contact pieces 11 on the IC body 4 through an opening as will be described, so as to be subjected to connection with the socket.

FIGS. 8 through 11 show another example, in which the lead pattern is formed on the inner upper surface side which is held in superimposed relation with the IC body 4, and the first contact pads 12 are disposed likewise on the inner upper surface side which is held in superimposed relation with the IC body 4. On the other hand, the second contact pads 15 are arranged such that they are exposed to the outside at the upper surface of the wiring sheet 6 placed opposite to the contacts. The IC body 4 is received in the IC receiving portion 3 such that the former is permitted to slightly move therein in a horizontal direction. In other words, the IC body 4 is received in the IC receiving portion 3 such that the former can slidingly move on the upper surface of the support seat 5 in the horizontal direction.

Figure 14:
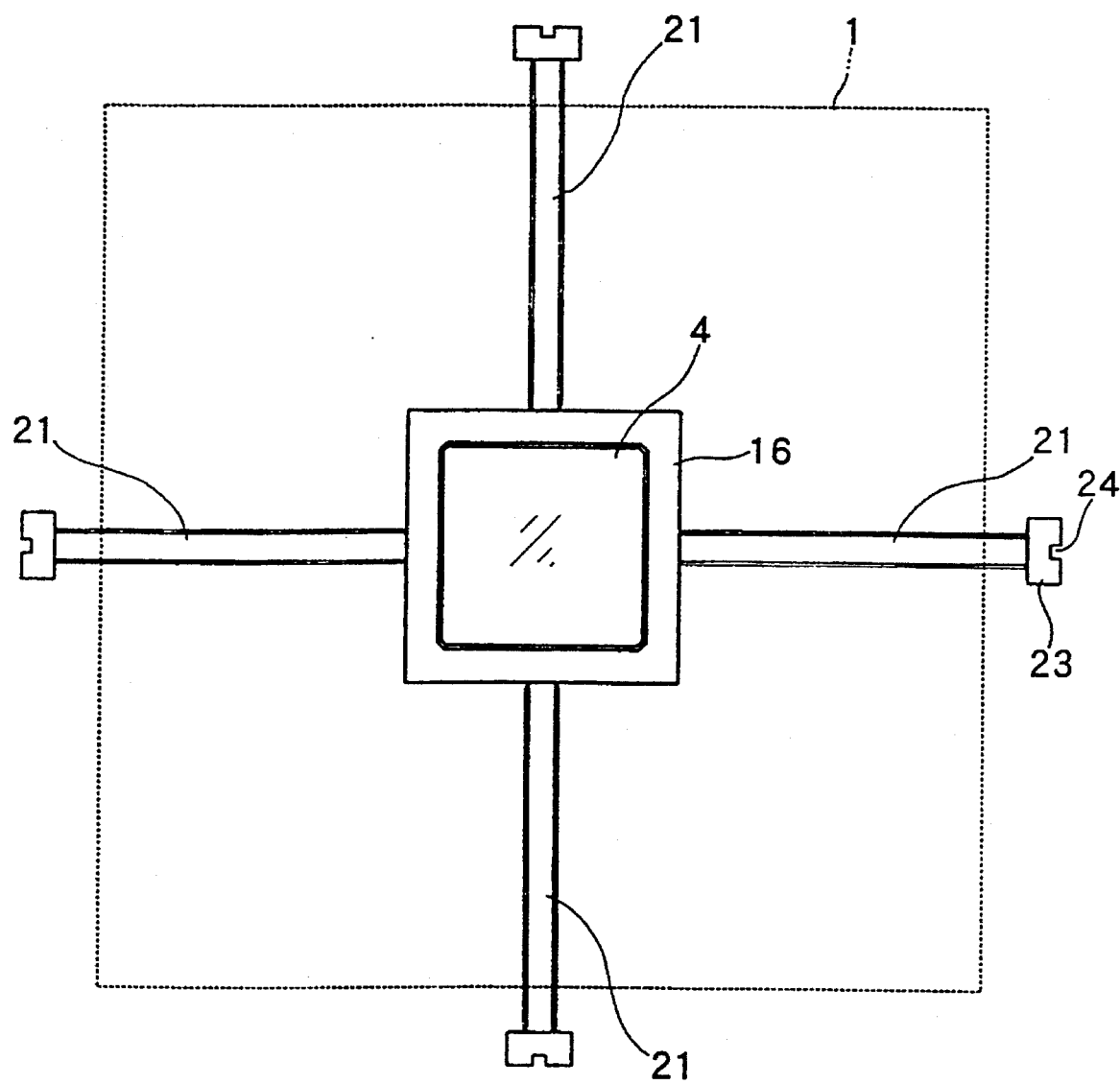
FIG. 14 is a plan view showing a protective case of an IC body and means for adjusting the same in the above respective embodiments.
Figure 16:
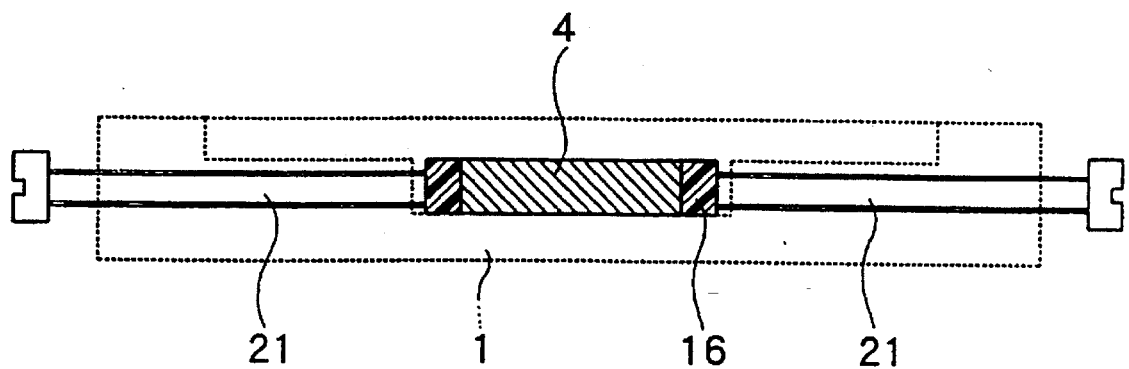
FIG. 16 is a sectional view of FIG. 14, but showing another example of the protective case.

As shown in FIGS. 14 and 16, a modification is made possible in which the IC body 4 is received in a protective case 16 with the contact elements 11 on the IC body 11 permitted to be exposed outside from an open upper surface of the protective case 16.

The IC body 4 is tightly received in the protective case 16 such that there is almost no room left for playing. The case 16 is, in turn, received in the IC receiving portion 3 such that the former is permitted to slightly move therein in a horizontal direction. In other words, the protective case 16 is received in the IC receiving portion 3 such that the former can slide on the upper surface of the support seat 5 in the horizontal direction while holding the IC body 4.

Figure 15:
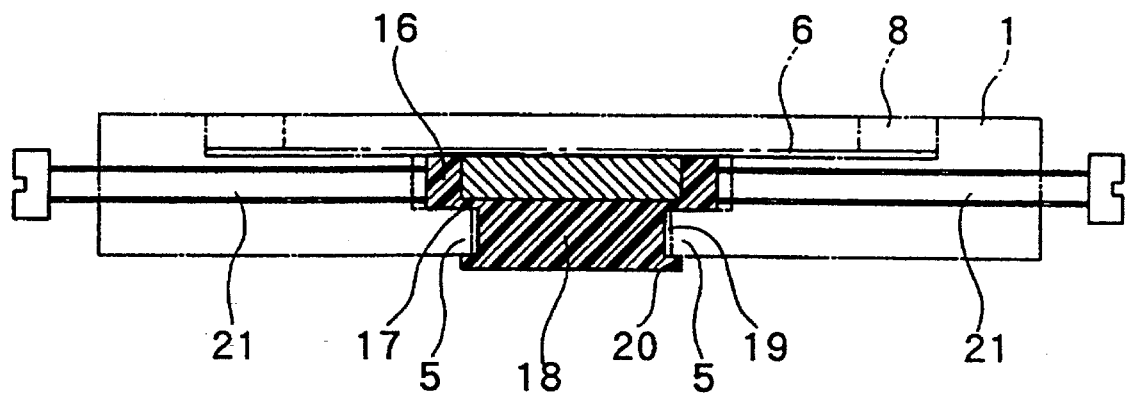
FIG. 15 is a sectional view of FIG. 14, but showing one example of the protective case.

As shown in FIG. 15, the protective case 16 includes a bottom wall 17 which supports the IC body 4. This bottom wall 17 is supported on the support seat 5. The bottom wall 17 is provided with a fitting portion 18. This fitting portion 18 is loosely fitted into an opening 19 formed in the support seat 5 and a retaining portion 20 formed at an end portion of the support seat 5 is brought into engagement with an edge portion of a lower surface of the opening 19 so that the protective case 16 does not escape from the carrier body 1. At the same time, the protective case 16 is permitted to move in the horizontal direction within a range of the play which the fitting portion 18 has in the opening 19.

As shown in FIG. 16, a protective case 16 is formed of a generally square frame member which has an opening formed all the way through an upper surface to a lower surface thereof. The IC body 4 is fitted in the protective case 16 and firmly secured to an inner peripheral surface of the case by bonding or the like. An outer peripheral surface of this protective case 16 is pressed by positioning pins 21 which will be described later.

As described above, either the IC carrier body 4 is movably received directly in the IC receiving portion 3 of the carrier body 1, or the IC body 4 is received in the protective case 16 and then received in the IC receiving portion 3 of the carrier body 1 through the protective case 16. The carrier body 1 is provided with an adjustment means for adjusting the installing position by pressing the sides of the IC body 4 or the sides of the protective case 16, in which the IC body 4 is already received, within the IC receiving portion 3.

As one concrete example as shown in FIGS. 1 through 3, 14 through 16, and elsewhere, there is provided adjusting members as represented by the positioning pins 21. The positioning pins 21 are pierced through the carrier body 1 from outer side surfaces of the carrier body 1 toward the inner surfaces of the IC receiving portion. The positioning pins 21 are reciprocally moved by being threadedly engaged with an inner wall of the through-holes 22, respectively. More specifically, a tip of each of the positioning pins 21 can extend into the IC receiving portion 3. The sides of the IC body 4 are placed opposite to the sides of the protective case 16. A head portion 23 of the positioning pin 21 projects from the outer side surface of the carrier body 1. The positioning pin 21 is reciprocally moved by inserting a driver into a minus groove or plus groove formed at the head portion. As the positioning pin 21 is moved forwardly, it presses the side surface of the IC body 4, or the side surface of the protective case 16) to slightly move it in the horizontal direction.

The adjusting members as represented by the above-mentioned positioning pins 21 are arranged such that they are capable of pressing a plurality of side surfaces or corner portions of the IC body 4 or protective case 16. As shown for example in FIG. 14, a number, four, of the positioning pins 21 are radially arranged so as to be capable of pressing the four side surfaces of the IC body 4 or protective case 16. By individually reciprocally moving the four positioning pins 21, the IC body 4 or protecting case 16 can be horizontally moved in all directions in a plane. By doing this, the installing position of the IC body 4 can be slightly adjusted relative to the wiring sheet 6, so that the IC contact elements 11 and the first contact pads 12 can be placed correctly opposite to each other.

The wiring sheet 6 is provided with openings 13 through which the correctly opposing condition between the IC contact elements 11 and the first contact pads 12 can be visually confirmed. FIGS. 1 through 7 show a concrete example of the openings 13. As shown in these Figures, the inner ends of the leads 10 (first contact pads 12) are concentrated at the central portion of the wiring sheet 6 and arranged along the respective sides of the IC body 4 which is placed on the central portion, such that they are placed opposite to the IC contact elements 11, respectively, arranged along the respective sides of the IC body 4. In FIGS. 1 through 7, the openings 13 are formed along the parts where the first contact pads 12 and the IC contact elements 11 are disposed opposite to each other. That is, the openings 13 are provided at the four sides or at least opposing two sides of the IC body 4, such that all or most of the first contact pads 12 and the IC contact elements 11, which are placed opposite to each other at the respective sides, can be visually recognized.

The opposing condition between the first contact pads 12 and the IC contact elements 11 can be clearly visually confirmed through the openings 13. By operating the positioning pins 21 while visually confirming the opposing condition, the IC body 4 can be slightly moved along the inner upper surface of the sheet 6. By doing this, the first contact pads 12 and the IC contact elements 11 can be placed correctly opposite to each other. The IC body 4 is clamped at the side surfaces thereof by the plurality of positioning pins 21 so that the former cannot move, and fixed at the correctly opposing positions.

On the other hand, the wiring sheet 6 is positioned by the inner surfaces or inner corner portions of a peripheral wall arranged in a generally square configuration so as to define the sheet receiving portion 2 of the carrier body 1.

Figure 19:
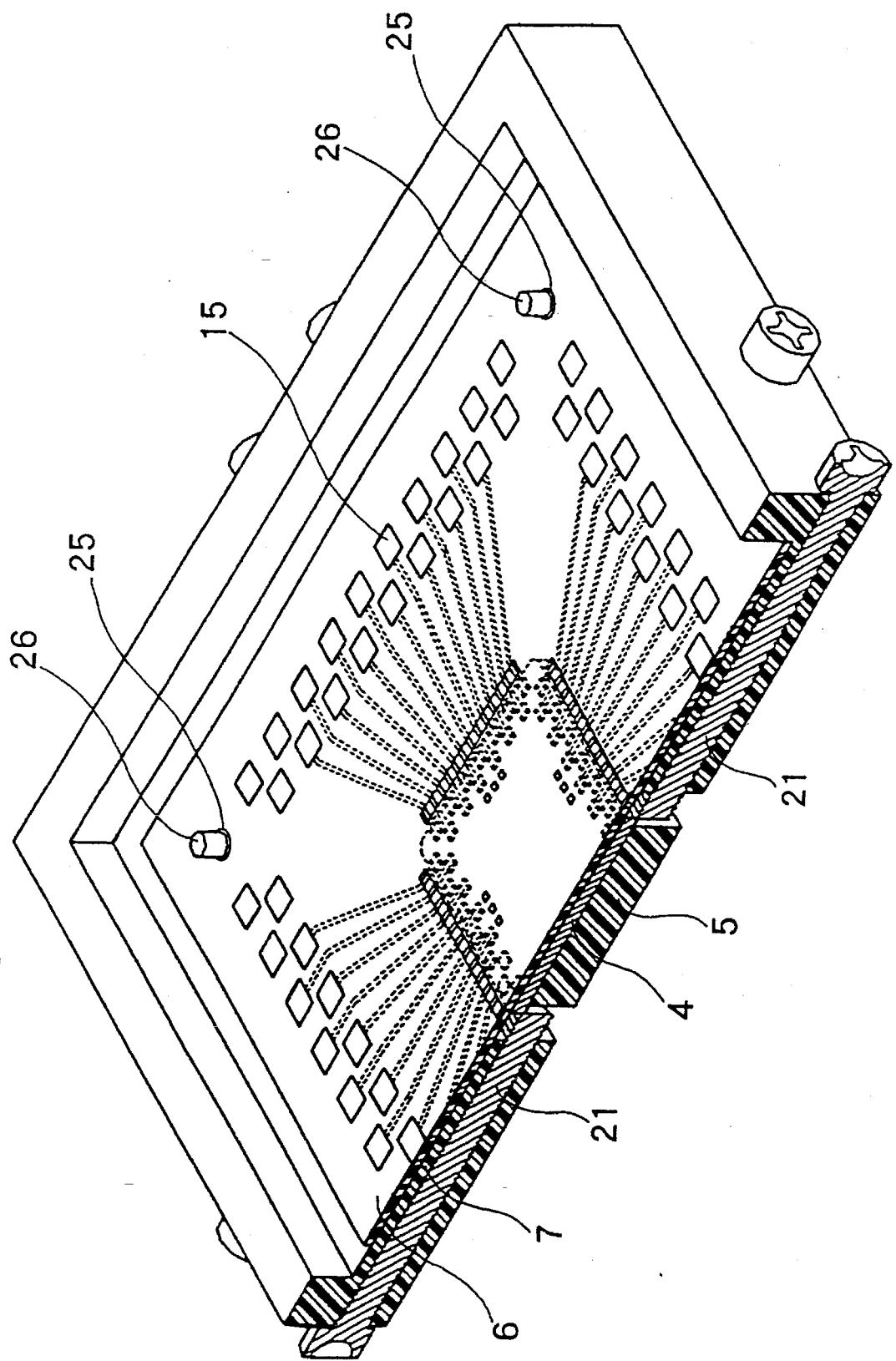
FIG. 19 is a half-cut perspective view of an IC carrier, showing means for positioning a wiring sheet.

The wiring sheet 6 is positioned by the peripheral wall 1a. Besides, as shown in FIGS. 2, 19, and as elsewhere, the peripheral edge portions, for example, the corner portions, of the wiring sheet 6 are provided with positioning apertures 25, and as shown in FIG. 19, as well as elsewhere, the corner portions of the support seat 7 for the wiring sheet 6 are provided with positioning posts 26 extending upwardly. The positioning posts 26 are inserted into the positioning apertures 25 so as to support the wiring sheet 6 at a predetermined position an the support seat 7. At this time, the diameter of each of the positioning posts 26 is formed smaller than the diameter of the corresponding positioning aperture 25. Owing to this difference in diameter, the wiring sheet 6 can be horizontally moved in all directions. After the wiring sheet 6 is placed correctly opposite to the IC body 4 by the above-mentioned horizontal movement, the frame member 8 is tightly secured to the carrier body 1 by the screws 9 so that the wiring sheet 6 can be assuredly held between the frame member 8 and the carrier body 1.

Figure 20:
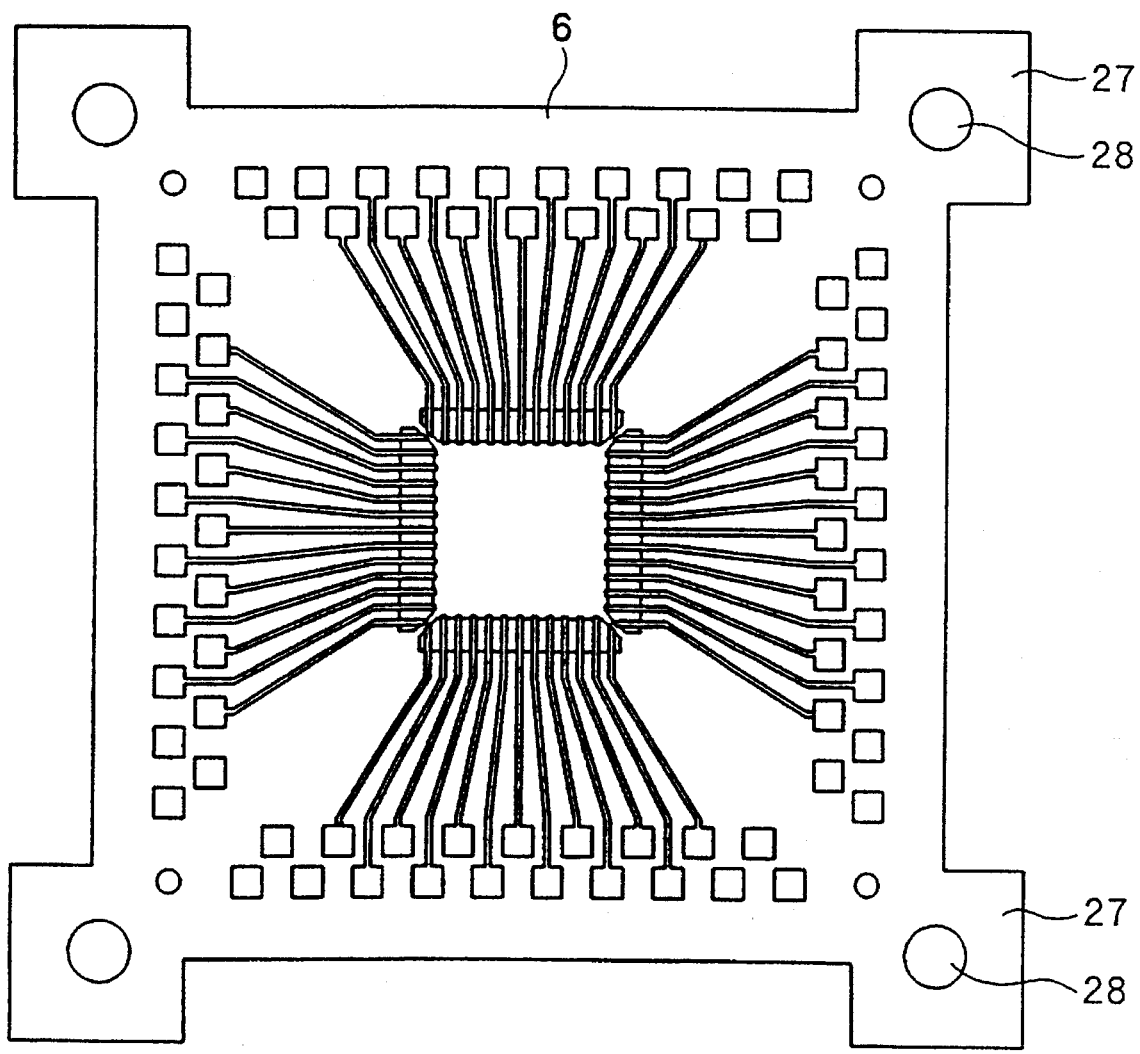
FIG. 20 is a plan view showing another example of the wiring sheet.
Figure 21:
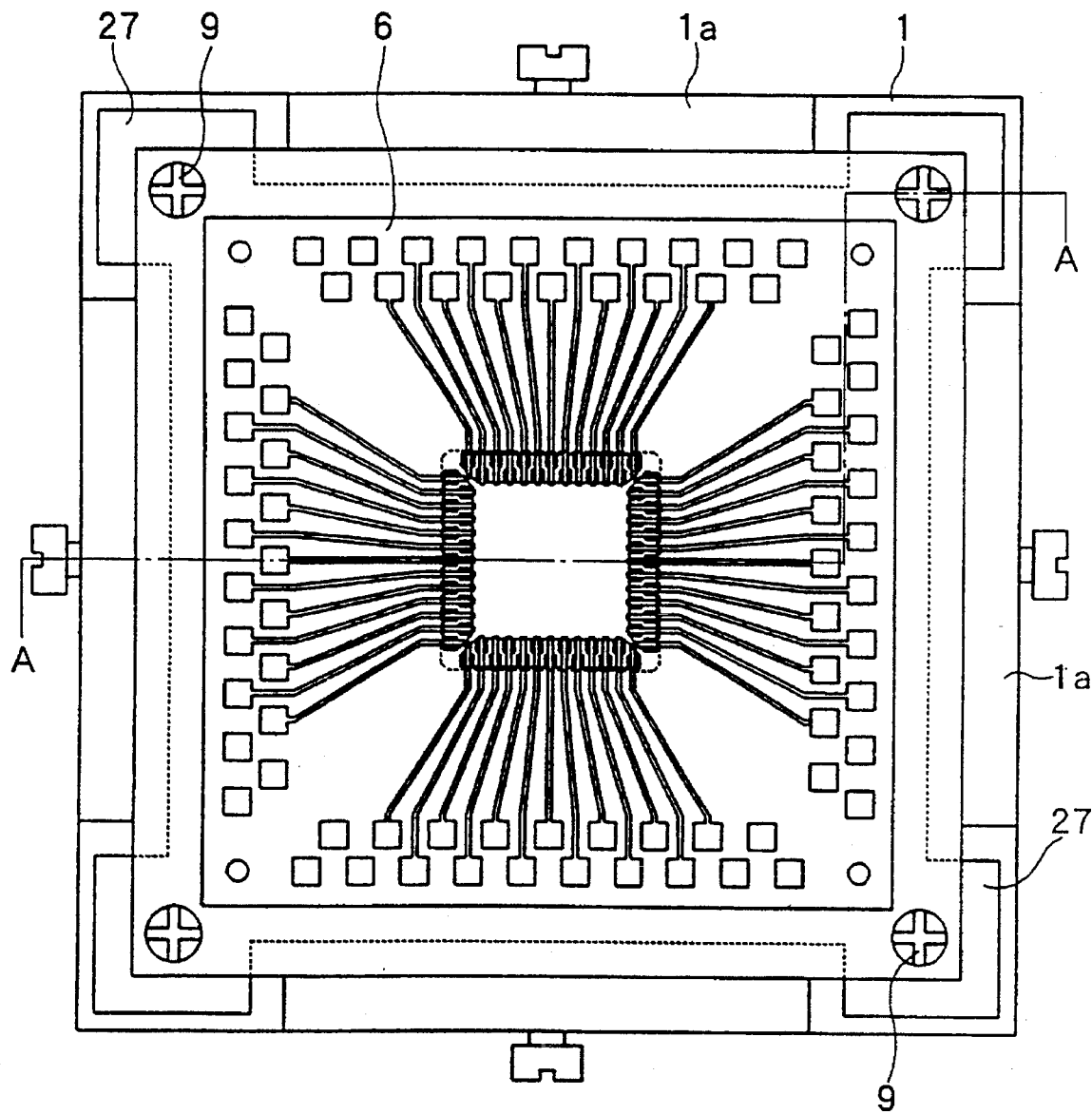
FIG. 21 is a plan view of an IC carrier using the wiring sheet of FIG. 20.
Figure 22:
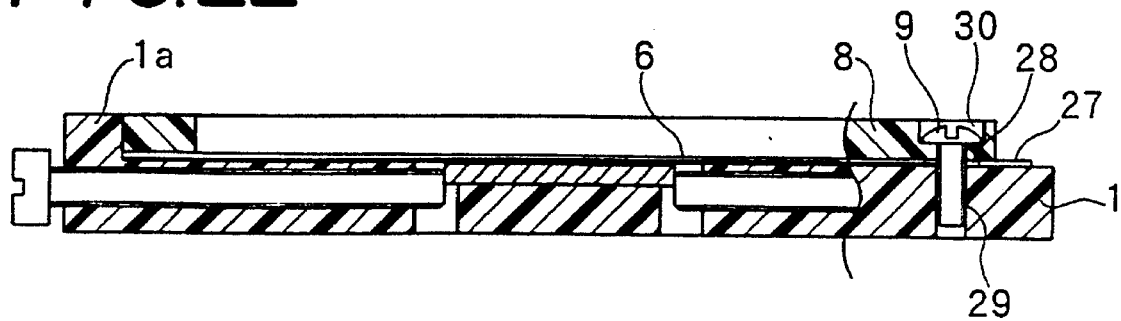
FIG. 22 is a sectional view of the IC carrier taken along line A—A in FIG. 21.

FIGS. 20, 21 and 22 show another embodiment in which the screws 9 for tightly securing the frame member 8 also serve as the positioning pins. As shown in FIG. 20, the corner portions of the wiring sheet 6 are provided respectively with mounting elements 27 integrally protruded therefrom. Mounting apertures 28 also serving as the positioning apertures are formed in the mounting elements 27, respectively. The screws 9 are inserted into the mounting apertures 28, such that the tips of the screws are threadedly engaged with threaded holes 29 formed in the corner portions of the support seat 7 of the carrier body 1. By correctly threading the screws 9 into corresponding mounting apertures 28, respectively, the wiring sheet 6 can be located in a predetermined position of the support seat 7, that is, correct relative position with respect to the IC body 4.

The screws 9 are threaded into the mounting apertures 30 formed in the corner portions 30 of the frame member 8 to come into connection with the carrier body. 1. By doing this, the wiring sheet 6 is fixed between the frame member 8 and the carrier body 1. It may be arranged, as in the previous description, such that the diameter of each of the shaft portions of the screws 9 is formed smaller than the diameter of the corresponding positioning aperture 28. Owing to this difference in diameter, the wiring sheet 6 can be horizontally moved along the support seat 7 in all directions.

By assembling the carrier body 1, the IC body 4 and the wiring sheet 6 together as mentioned above, the IC body 4 is hidden and favorably protected between the carrier body 1 and the wiring sheet 6 so as to be subjected to delivery and storage. By loading the assembly directly on the socket, the second contact pads 15, which are disposed on the upper surface of the wiring sheet 6 and are exposed to the outside through the central opening of the frame 8, are pressed against the contacts on the socket for electrical connection so as to be subjected to aging tests. The socket is provided with a resilient pressing member adapted to press the superimposed portion of the wiring sheet 6 so as to press the first contact pads 12 against the IC contact elements 11.

Figure 8:
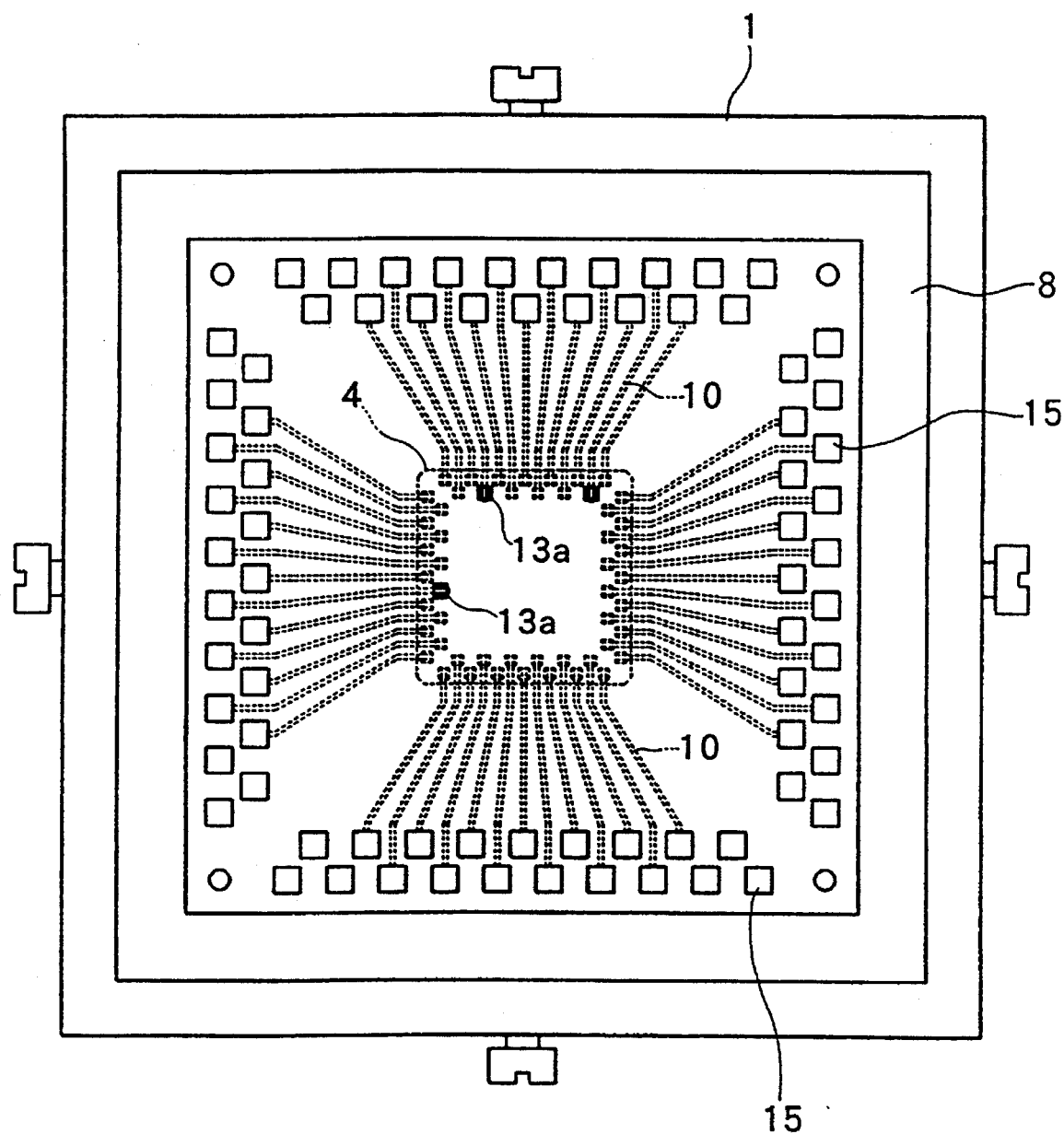
FIG. 8 is a plan view of an IC carrier according to a third embodiment of the present invention.
Figure 9:
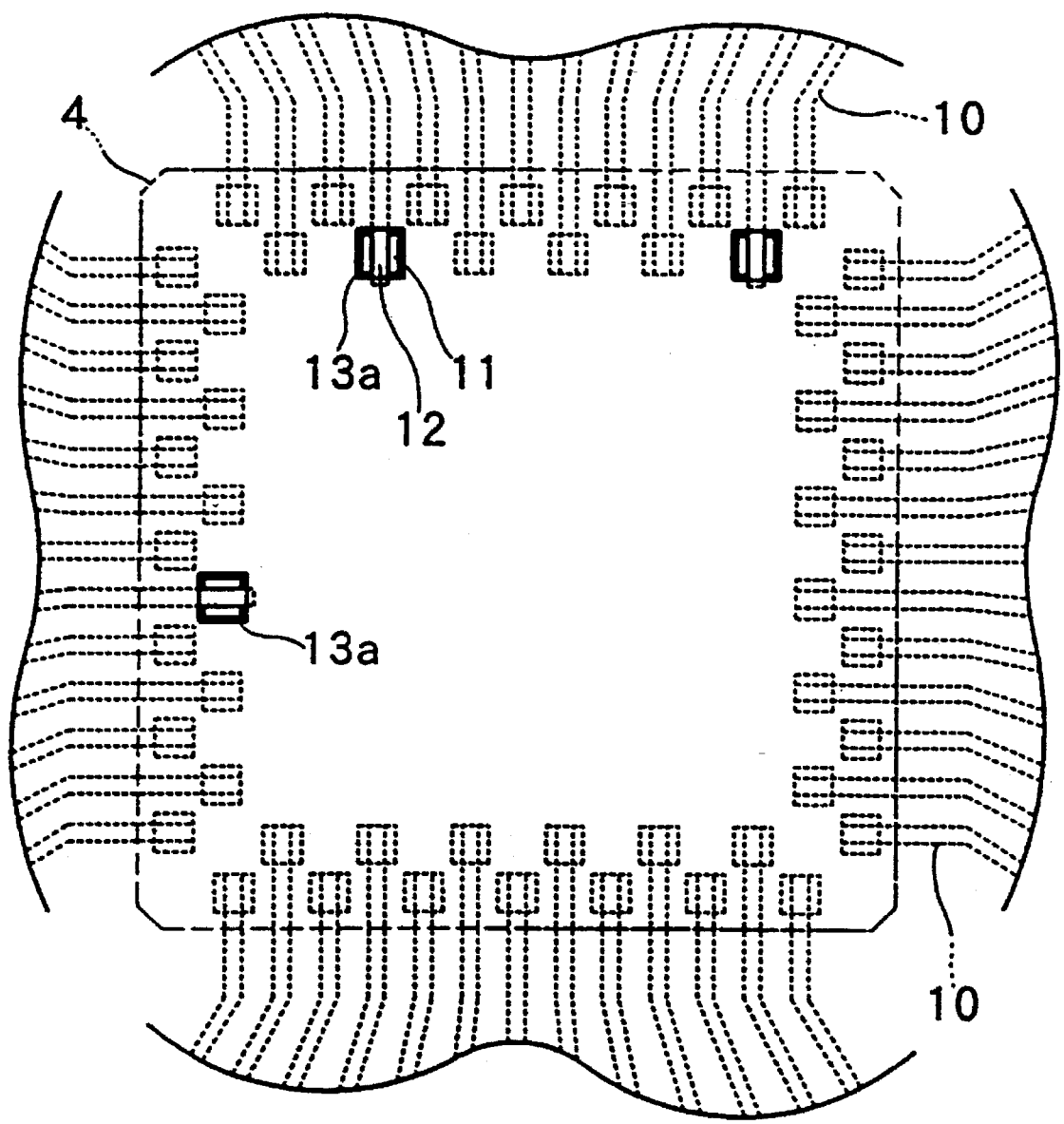
FIG. 9 is an enlarged plan view showing a contacting portion between a wiring sheet and an IC body in the above IC carrier.
Figure 10:
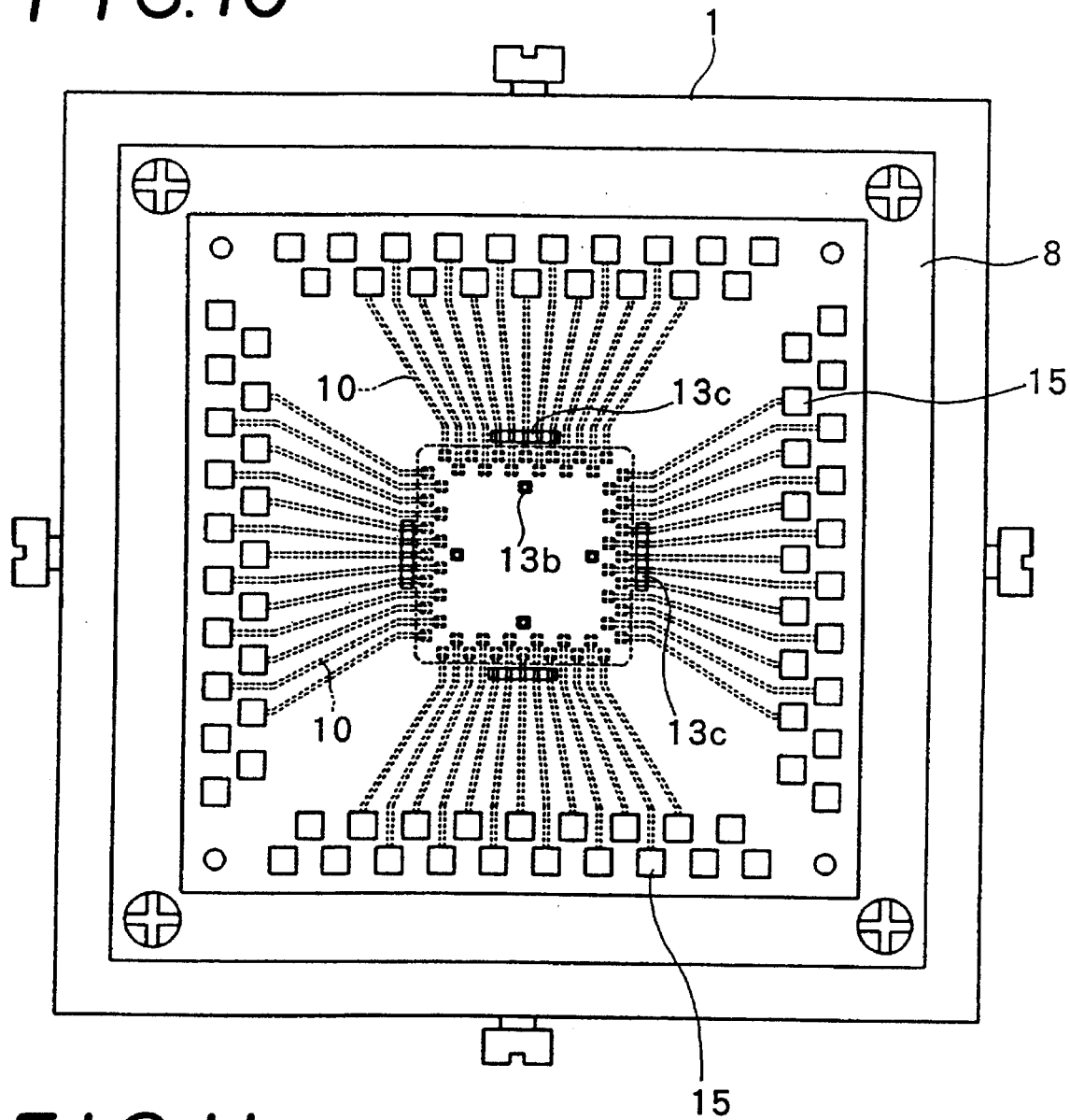
FIG. 10 is a plan view of an IC carrier according to a fourth embodiment of the present invention.
Figure 11:
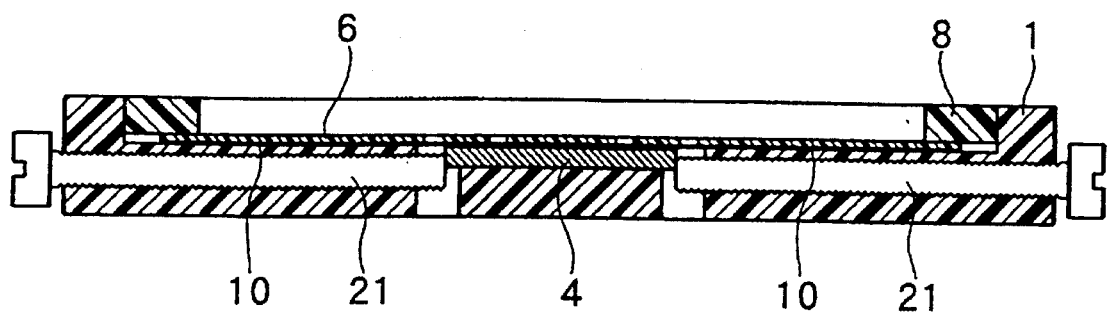
FIG. 11 is a cross-sectional view of FIG. 10.
Figure 12:
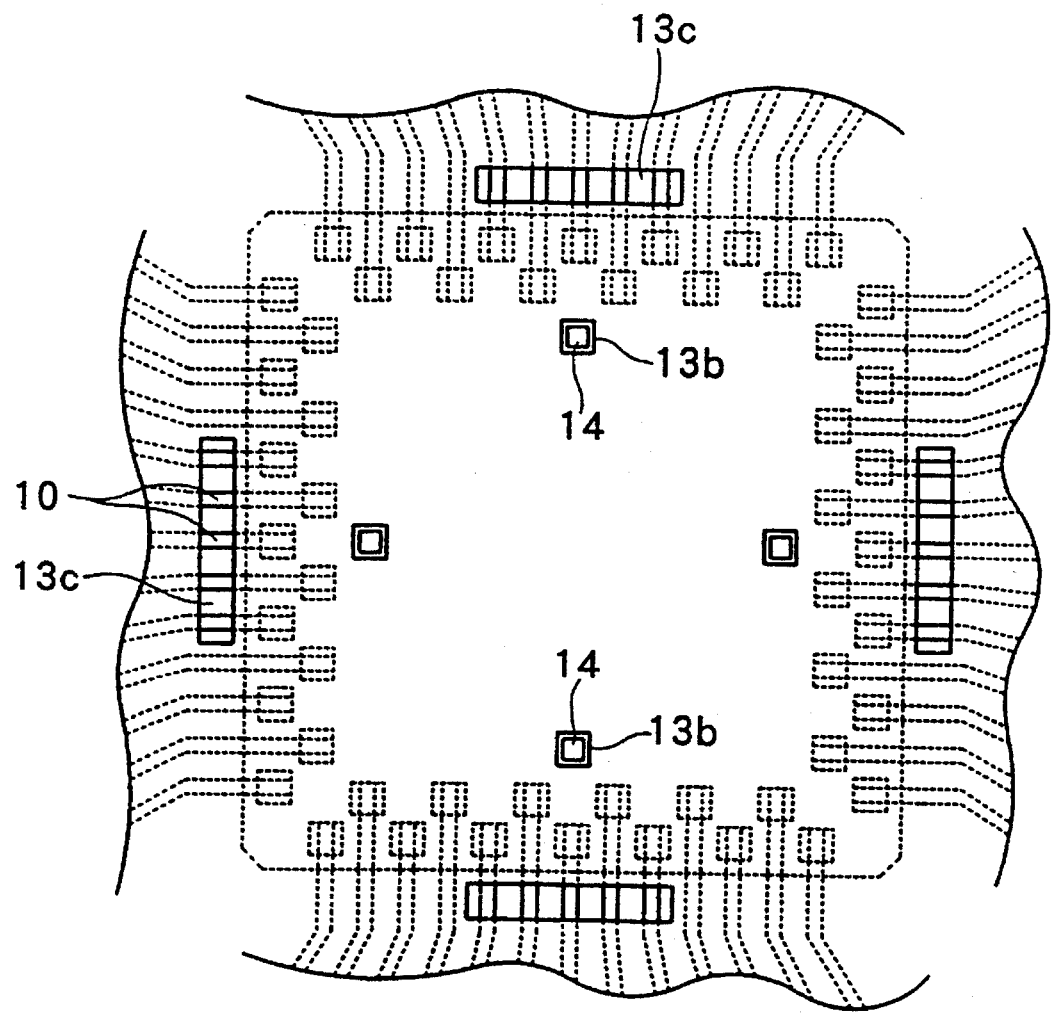
FIG. 12 is an enlarged plan view showing a contacting portion between a wiring sheet and an IC body in the above IC carrier.
Figure 13:
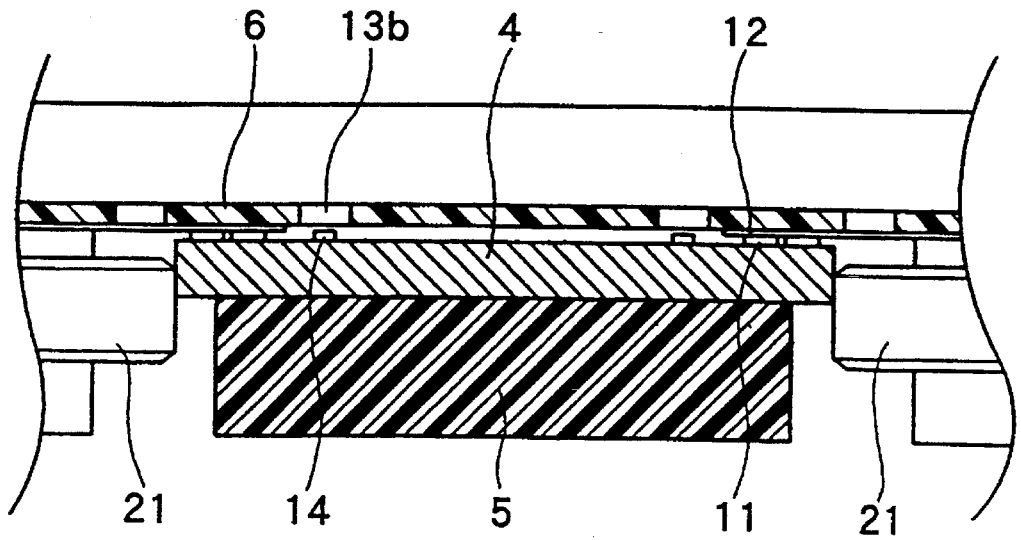
FIG. 13 is an enlarged cross-sectional view of FIG. 12.

FIGS. 8 and 9 show an example in which a limited number of tiny openings 13a, through which the opposing condition between the first contact pads 12 and the IC contact elements 11 can be visually confirmed, are provided for opposing pairs (units) of the first contact pads 12 and the IC contact elements 11. That is, by arranging a limited number of the openings 13a (one for each unit) on the two or four sides of the IC body 4, in other words, by providing one opening 13a for each of the first contact pads 12 or IC contact elements 11 and a limited number of such opening 13a arrangements on the two or four sides of the IC body 4, the opposing condition between all of the first contact pads group and all of the IC contact elements group can be visually recognized.

FIGS. 10 through 13 show an example in which a plurality of dot-like marks 14 are provided at suitable locations on the upper surface of the IC body 4. For example, as illustrated, the dot-like marks 14 are provided at two locations on the horizontal center line and at two locations on the vertical center lines of the IC body 4, respectively, and the wiring sheet 6 is provided with the tiny openings or holes 13b at locations opposite to the marks 14. The marks 14 are made by forming dot-like recesses in the upper surface of the IC body 4, or bonding tiny pieces thereto, or painting thereon.

Figure 18:
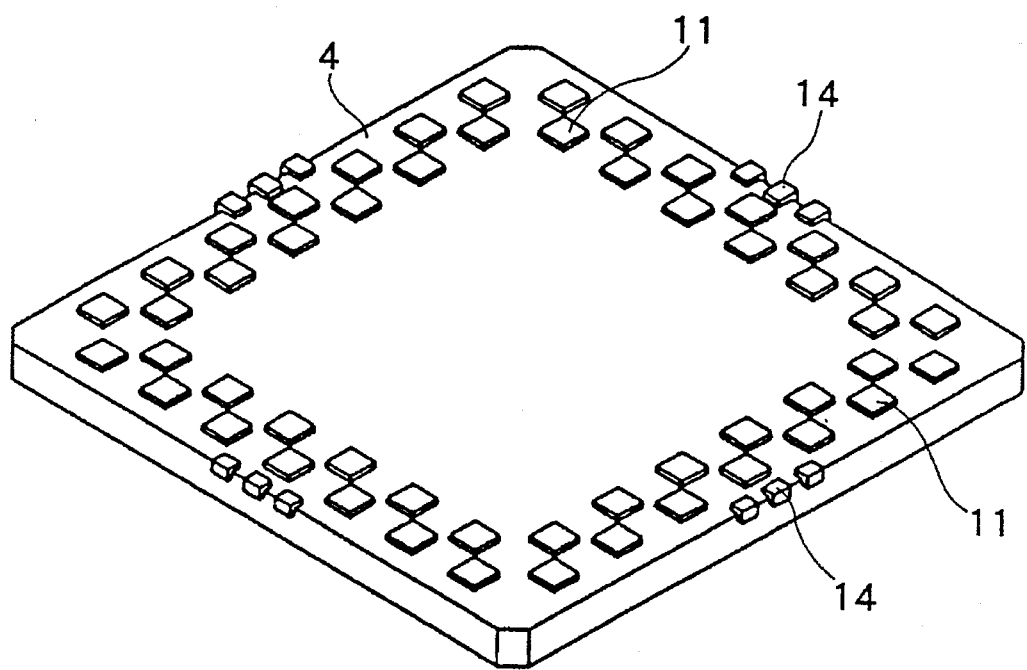
FIG. 18 is a perspective view of an IC body according to another embodiment.

As shown in FIG. 18, each of the marks 14 may be formed in an L-shape extending from an upper edge portion of the IC body 4 to a side surface thereof and such marks 14 may be arranged along at least two sides of the IC body 4. Preferably, these marks (edge marks) 14 are also arranged on the horizontal and vertical center lines of the IC body, and the openings 13b are formed at locations opposite to the marks 14.

Slot-like openings 13c are formed in outer areas of the respective sides or at least two opposite sides of the IC body 4, so that the plurality of leads 10 can be visually recognized in the vicinity of the part where the leads 10 are overlapped with the IC body 4, through the slot-like openings 13c. The openings 13c are preferably arranged such that they have their own centers on the center lines of the openings 13b, respectively. In other words, the openings 13b and 13c and the marks 14 are arranged such that they have their own centers on the horizontal and vertical center lines of the IC body 4, respectively.

The opposing condition between the first contact pads 12 and the IC contact elements 11 can be confirmed by directly visually watching the marks 14 through the openings 13b as in the manner described above. In case the opposing condition is not correct, it can be corrected by slightly moving the IC body 4 through operation of the positioning pins 21. By doing this, there can be obtained a correct corresponding condition between the first contact pads 12 and the IC contact pieces 11.

In the case where the openings 13c are provided, the leads 10 which can be visually recognized through these openings 13c and the marks 14 which can be visually recognized through the openings 13b are compared to check whether or not the leads 10 and the marks 14 are in alignment relative to each other or to check the parallelism.

The present invention contemplates an arrangement in which only the openings 13b are provided and the openings 13c are not provided.

As described in the foregoing, since the IC carrier is comprised of the carrier body having the IC body and the wiring sheet, the lead pattern is enlarged by the wiring sheet so that the leads on the IC body can be correctly connected to the socket through the second contact pads which are arranged on the upper surface of the wiring sheet. Accordingly, the arrangement of the present invention can effectively cope with the very small pitch arrangement of the IC contact elements on the IC body.

Moreover, since the IC body is hidden between the IC carrier and the wiring sheet, it can be effectively protected from external shocks. This means that the wiring sheet can function as a means for protecting the IC body and also as a means for forming the leads.

Furthermore, it can be checked, through the openings formed in the wiring sheet, whether or not the opposing condition between the leads on the wiring sheet and the contacting portions on the IC body are correct, and positioning can be easily carried out at the time the IC body 4 with the wiring sheet superimposed thereon is assembled together with the carrier body 1. This adjustment operation is carried out by slightly moving the IC body through the operation of the adjustment means such as the positioning pins disposed on the carrier body for pressing the side surfaces of the IC body or the side surfaces of the protective case in which the IC body is received, while visually watching through the openings. This operation allows a correction to be positively and easily made so that the IC body and the contacting portions on the wiring sheet are correctly held in opposite relation.

While the present invention has been described in the form of preferred embodiments, the invention is, of course, not limited to these embodiments and various changes and modifications can be made without departing from the spirit of the invention.

What is claimed is:

1. An apparatus comprising:

a carrier body having an IC receiving portion, and an IC body support seat provided in said IC receiving portion;

an IC body removably mounted in said IC receiving portion of said carrier body, said IC body having a plurality of contact elements thereon;

a wiring sheet detachably fixed to said carrier body in superposed covering relation to said IC body, such that said IC body is interposed between said carrier body and said wiring sheet;

a frame member removably mounted to said carrier body with said wiring sheet interposed between said carrier body and said frame member, said wiring sheet being disengagably clamped between said frame member and said carrier body;

wherein said wiring sheet has a lead pattern formed thereon, said lead pattern comprising a plurality of first contact pads at an inner portion of said wiring sheet, a plurality of second contact pads at an outer portion of said wiring sheet and a plurality of leads extending between said first contact pads and said second contact pads, respectively;

wherein said first contact pads of said wiring sheet are positioned relative to said carrier body so as to be removably engageable with said contact elements of said IC body, respectively; and wherein said frame member has a central opening therethrough, and said second contact pads of said lead pattern on said wiring sheet are exposed to the outside through said central opening of said frame member such that said second contact pads can be brought into contact with contacts of an IC socket.

2. An apparatus as recited in claim 1, further comprising an IC case;

wherein said IC body is encased in said IC case; and wherein said IC case is removably mounted in said IC receiving portion of said carrier body.

3. An apparatus as recited in claim 1, wherein said wiring sheet is substantially planar; and said IC body is movably mounted in said IC receiving portion of said carrier body for movement substantially parallel to a plane of said wiring sheet.

4. An apparatus as recited in claim 1, wherein said carrier body includes a wiring sheet support seat on which said wiring sheet is removably supported;

said IC body support seat is offset below said wiring sheet support seat by a distance equal to a thickness of said IC body; and an upper surface of said IC body is flush with an upper surface of said wiring sheet support seat.

5. An apparatus as recited in claim 1, wherein said wiring sheet is substantially planar;

said IC body is movably mounted in said IC receiving portion of said carrier body for movement substantially parallel to a plane of said wiring sheet;

adjustment means are provided for adjustably moving said IC body substantially parallel to the plane of said wiring sheet;

said carrier body has a sheet receiving portion, said wiring sheet being detachably fixed in said sheet receiving portion of said carrier body; and a frame member is removably mounted to said sheet receiving portion of said carrier body with said wiring sheet interposed between said carrier body and said frame member, said frame member disengageably securing said wiring sheet to said carrier body.

6. An apparatus as recited in claim 1, wherein said wiring sheet is formed of a flexible synthetic resin film.

7. An apparatus as recited in claim 2, wherein said wiring sheet is substantially planar; and said IC case and said IC body are movably mounted in said IC receiving portion of said carrier body for movement substantially parallel to a plane of said wiring sheet.

8. An apparatus as recited in claim 2, wherein said carrier body includes a wiring sheet support seat on which said wiring sheet is removably supported;

said IC body support seat is offset below said wiring sheet support seat by a distance equal to a thickness of said IC body; and an upper surface of said IC body is flush with an upper surface of said wiring sheet support seat.

9. An apparatus as recited in claim 2, wherein said wiring sheet is substantially planar;

said IC case and said IC body are movably mounted in said IC receiving portion of said carrier body for movement substantially parallel to a plane of said wiring sheet;

adjustment means are provided for adjustably moving said IC case and said IC body substantially parallel to the plane of said wiring sheet;

said carrier body has a sheet receiving portion, said wiring sheet being detachably fixed in said sheet receiving portion of said carrier body; and a frame member is removably mounted to said sheet receiving portion of said carrier body with said wiring sheet interposed between said carrier body and said frame member, said frame member disengageably securing said wiring sheet to said carrier body.

10. An apparatus as recited in claim 7, further comprising adjustment means for adjustably moving said IC case and said IC body substantially parallel to the plane of said wiring sheet.

11. An apparatus as recited in claim 9, wherein said carrier body includes an IC body support seat and a wiring sheet support seat;

said IC body support seat is offset below said wiring sheet support seat by a distance equal to a thickness of said IC body; and an upper surface of said IC body is flush with an upper surface of said wiring sheet support seat.

12. An apparatus as recited in claim 3, further comprising adjustment means for adjustably moving said IC body substantially parallel to the plane of said wiring sheet.

13. An apparatus as recited in claim 5, wherein said carrier body includes a wiring sheet support seat on which said wiring sheet is removably supported;

said IC body support seat is offset below said wiring sheet support seat by a distance equal to a thickness of said IC body; and an upper surface of said IC body is flush with an upper surface of said wiring sheet support seat.

14. An apparatus comprising:

a carrier body having an IC receiving portion, and an IC body support seat provided in said IC receiving portion;

an IC body removably mounted in said IC receiving portion of said carrier body, said IC body having a plurality of contact elements thereon;

a wiring sheet detachably fixed to said carrier body in superposed covering relation to said IC body, such that said IC body is interposed between said carrier body and said wiring sheet;

a frame member removably mounted to said carrier body with said wiring sheet interposed between said carrier body and said frame member, said wiring sheet being disengagably clamped between said frame member and said carrier body;

wherein said wiring sheet has a lead pattern formed thereon, said lead pattern comprising a plurality of first contact pads at an inner portion of said wiring sheet, a plurality of second contact pads at an outer portion of said wiring sheet and a plurality of leads extending between said first contact pads and said second contact pads, respectively;

wherein said first contact pads of said wiring sheet are positioned relative to said carrier body so as to be removably engageable with said contact elements of said IC body, respectively;

wherein said frame member has a central opening therethrough, and said second contact pads of said lead pattern on said wiring sheet are exposed to the outside through said central opening of said frame member such that said second contact pads can be brought into contact with contacts of an IC socket;

wherein said wiring sheet has a confirmation window formed therein; and wherein said IC body has an alignment indicator thereon which is alignable with said confirmation window.

15. An apparatus as recited in claim 14, wherein said carrier body includes a wiring sheet support seat on which said wiring sheet is removably supported;

said IC body support seat is offset below said wiring sheet support seat by a distance equal to a thickness of said IC body; and an upper surface of said IC body is flush with an upper surface of said wiring sheet support seat.

16. An apparatus as recited in claim 14, wherein said wiring sheet is substantially planar;

said IC body is movably mounted in said IC receiving portion of said carrier body for movement substantially parallel to a plane of said wiring sheet;

adjustment means are provided for adjustably moving said IC body substantially parallel to the plane of said wiring sheet;

said carrier body has a sheet receiving portion, said wiring sheet being detachably fixed in said sheet receiving portion of said carrier body; and a frame member is removably mounted to said sheet receiving portion of said carrier body with said wiring sheet interposed between said carrier body and said frame member, said frame member disengageably securing said wiring sheet to said carrier body.

17. An apparatus as recited in claim 14, wherein said alignment indicator is constituted by one of said contact elements of said IC body.

18. An apparatus as recited in claim 14, wherein said alignment indicator is constituted by a positioning mark formed on said IC body.

19. An apparatus as recited in claim 14, wherein said wiring sheet is formed of a flexible synthetic resin film.

20. An apparatus as recited in claim 14, wherein said wiring sheet is substantially planar; and said IC body is movably mounted in said IC receiving portion of said carrier body for movement substantially parallel to a plane of said wiring sheet.

21. An apparatus as recited in claim 20, further comprising adjustment means for adjustably moving said IC body substantially parallel to the plane of said wiring sheet.

* * * * *